US006372545B1

(12) United States Patent
Fan et al.

(10) Patent No.: US 6,372,545 B1
(45) Date of Patent: Apr. 16, 2002

(54) METHOD FOR UNDER BUMP METAL PATTERNING OF BUMPING PROCESS

(75) Inventors: Fu-Jier Fan, Jubei; Kuo-Wei Lin, Hsinchu; Yen-Ming Chen, Hsinchu; Cheng-Yu Chu, Hsinchu; Shih-Jane Lin, Hsinchu; Chiou-Shian Peng, Hsinchu; Yang-Tung Fan, Jubei, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/814,039

(22) Filed: Mar. 22, 2001

(51) Int. Cl.[7] .......... H01L 21/44
(52) U.S. Cl. .......... 438/108; 257/780
(58) Field of Search .......... 438/108, 106, 438/612, 613; 257/737, 780

(56) References Cited

U.S. PATENT DOCUMENTS

| | | | | |
|---|---|---|---|---|
| 5,767,106 A | | 6/1998 | Mis et al. | 438/614 |
| 5,866,475 A | | 2/1999 | Yanagida | 438/613 |
| 5,888,892 A | | 3/1999 | Yanagida | 438/614 |
| 5,933,752 A | | 8/1999 | Yanagida | 438/613 |
| 6,015,652 A | * | 1/2000 | Ahiquist et al. | 430/315 |
| 6,077,765 A | | 6/2000 | Naya | 438/614 |
| 6,103,552 A | | 8/2000 | Lin | 438/113 |
| 6,232,147 B1 | * | 5/2001 | Matsuki et al. | 438/108 |

* cited by examiner

*Primary Examiner*—David Nelms
*Assistant Examiner*—Quoc Hoang
(74) *Attorney, Agent, or Firm*—George O. Saile; Stephen B. Ackerman; Stephen G. Stanton

(57) ABSTRACT

A method for forming an under bump metal, comprising the following steps. A semiconductor structure is provided having an exposed I/O pad. A patterned passivation layer is formed over the semiconductor structure, the patterned passivation layer having an opening exposing a first portion of the I/O pad. A dry film resistor (DFR) layer is laminated, exposed and developed to form a patterned dry film resistor (DFR) layer over the patterned passivation layer. The patterned dry film resistor (DFR) layer having an opening exposing a second portion of the I/O pad. The patterned dry film resistor (DFR) layer opening having opposing side walls with a predetermined profile with an undercut. A metal layer is formed over the patterned dry film resistor (DFR) layer, the exposed third portion of the I/O pad, and over at least a portion of the opposing side walls of the patterned dry film resistor (DFR) layer opening. The patterned dry film resistor (DFR) layer is lifted off, along with the metal layer over patterned dry film resistor (DFR) layer and over at least the portion of the opposing side walls, leaving the metal layer over the exposed second portion of the I/O pad. The metal layer over the exposed second portion of the I/O pad being an under bump metal.

35 Claims, 3 Drawing Sheets

22
26
27
26
18
30
18
28
16
16
14
14
10
12
24

METHOD FOR UNDER BUMP METAL PATTERNING OF BUMPING PROCESS

FIELD OF THE INVENTION

The present invention relates generally to methods of fabricating microelectronic devices and specifically to methods of fabricating solder bumps on microelectronic devices.

BACKGROUND OF THE INVENTION

Under bump metal (UBM) deposition is proceeded by sputtering and electroplating, and the patterning is achieved by various wet etching techniques before the bump formation. The complexity in so forming the bump metal is the weakness of this process. For copper bump formation, it is not easy to find a suitable etcher for copper. Further, there are many wet-etching solutions for UBM such as $NH_4OH+CuSO_4$ for copper etching and HF solution for titanium etching. Costs are increased due to the amount of wet-etching.

U.S. Pat. No. 5,767,010 to Mis et al describes a lift-off process for removing the solder dam.

U.S. Pat. No. 5,933,752 to Yanagida describes a process to form an undercoating by a lift-off process.

U.S. Pat. No. 5,866,475 to Yanagida describes a lift-off process for a barrier metal layer.

U.S. Pat. No. 5,888,892 to Yanagida describes a lift-off process in a bump process.

U.S. Pat. No. 6,077,765 to Naya describes a bump process with UBM steps.

SUMMARY OF THE INVENTION

Accordingly, it is an object of the present invention to provide a simpler method of under bump metal deposition/patterning.

Another object of the present invention is to provide a reduced cost method for under bump metal deposition/patterning.

A further object of the present invention is to provide a method for under bump metal deposition/patterning that reduces costs by eliminating wet-etching.

Other objects will appear hereinafter.

It has now been discovered that the above and other objects of the present invention may be accomplished in the following manner. Specifically, a semiconductor structure is provided having an exposed I/O pad. A patterned passivation layer is formed over the semiconductor structure, the patterned passivation layer having an opening exposing a first portion of the I/O pad. A dry film resistor (DFR) layer is laminated, exposed and developed to form a patterned dry film resistor (DFR) layer over the patterned passivation layer. The patterned dry film resistor (DFR) layer having an opening exposing a second portion of the I/O pad. The patterned dry film resistor (DFR) layer opening having opposing side walls with a predetermined profile with an undercut. A metal layer is formed over the patterned dry film resistor (DFR) layer, the exposed third portion of the I/O pad, and over at least a portion of the opposing side walls of the patterned dry film resistor (DFR) layer opening. The patterned dry film resistor (DFR) layer is lifted off, along with the metal layer over patterned dry film resistor (DFR) layer and over at least the portion of the opposing side walls, leaving the metal layer over the exposed second portion of the I/O pad. The metal layer over the exposed second portion of the I/O pad being an under bump metal.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Figure 1:
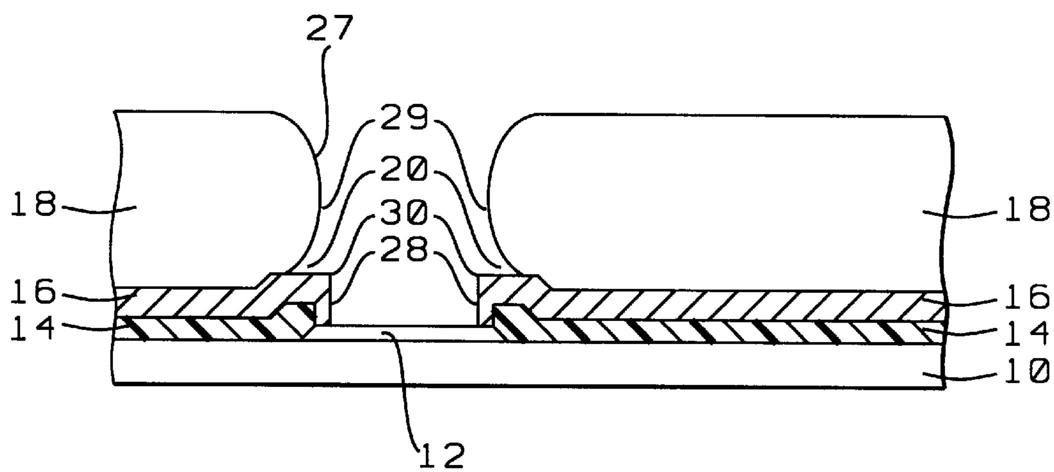
FIGS. 1 to 6 illustrate the preferred embodiment of the present invention.

As shown in FIG. 1, semiconductor structure 10 has exposed metal input/output (I/O) pad 12 that may be comprised of copper (Cu) or aluminum (Al). Semiconductor structure 10 is also understood to possibly include a semiconductor wafer or substrate, active and passive devices formed within the wafer, conductive layers and dielectric layers (e.g., inter-poly oxide (IPO), intermetal dielectric (IMD), etc.) formed over the wafer surface. The term "semiconductor structure" is meant to include devices formed within a semiconductor wafer and the layers overlying the wafer. I/O pad 12 is electrically connected to at least one device (not shown) within semiconductor structure 10.

Passivation layer 14 is formed over semiconductor structure 10 and exposed I/O pad 12 and is patterned to expose I/O pad 12. Passivation layer 14 is preferably from about 10,000 to 20,000 Å thick. Passivation layer 14 is preferably formed of plasma-enhanced silicon nitride, plasma-enhanced silicon oxide, phosphorous doped spin-on-glass (DSG or high density plasma silicon oxide and is more preferably formed of plasma-enhanced silicon nitride.

Layer 16 is then formed over passivation layer 14 and exposed I/O pad 12 and is patterned to expose I/O pad 12. Layer 16 is preferably formed of polyimide. Polyimide layer 16 is preferably from about 20,000 to 100,000 Å thick, is more preferably from about 20,000 to 100,000 Å thick.

Formation of First Patterned DFR Layer

First patterned dry film resistor (DFR) layer 18 is then formed over the structure. A first DFR layer s formed over the structure by lamination and is then patterned by exposure and development to form first patterned DFR layer 18. First patterned DFR layer 18 is preferably comprised of photosensitive material, positive photoresist or negative photoresist and is more preferably comprised of negative photoresist having a thickness of preferably from about 8 to 12 $\mu$m, more preferably from about 9 to 11 $\mu$m and most preferably about 10 $\mu$m.

The inventors have discovered that by altering the standard development time (STD) of preferably from about 120 to 240 seconds, more preferably from about 130 to 230 seconds and most preferably from about 150 to 210, by up to plus or minus (+) 20%, an acceptable first patterned DFR layer profile of opening 27, with opposing side walls 29, having an acceptable undercut 20 is obtained. That is, for example, for a 10 μm thick first DFR layer 18: (1) at the SDT an undercut of about 3.70 μm is obtained for a 10 μm thickness; (1) at about 120% of the SDT an undercut 20 of about 4.01 μm is obtained; (3) at about 110% of the SDT an undercut 20 of about 3.70 μm is obtained; (4) at about 90% of the SDT an undercut 20 of about 3.00 μm is obtained; and (5) and at about 80% of the SDT an undercut 20 of about 3.00 μm is obtained. The maximum allowable undercut is from about 3.0 to 5.0 μm for a 10 μm thick first DFR layer 18.

Figure 7:
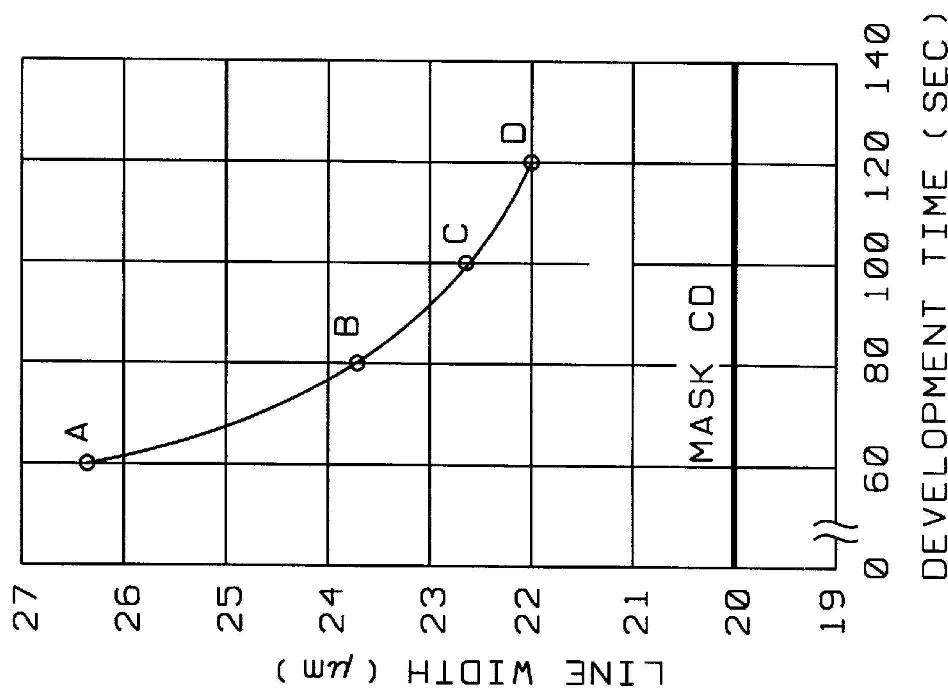
FIG. 7 is a graph of line width ($\mu$m) versus development time (seconds) illustrating first patterned DFR layer profile control by line width CK-SO92B/7059 highlighting four development times A, B, C, and D.

FIG. 7 is a graph of line width (μm) versus development time (seconds) illustrating first patterned DFR layer profile control by line width CK-SO92B/7059 highlighting four development times A, B, C, and D. (CK SO92B/7059 is the product 20 of a commercial developer and "MASK CD" is the pattern line width on the exposed area.)

Figure 8:
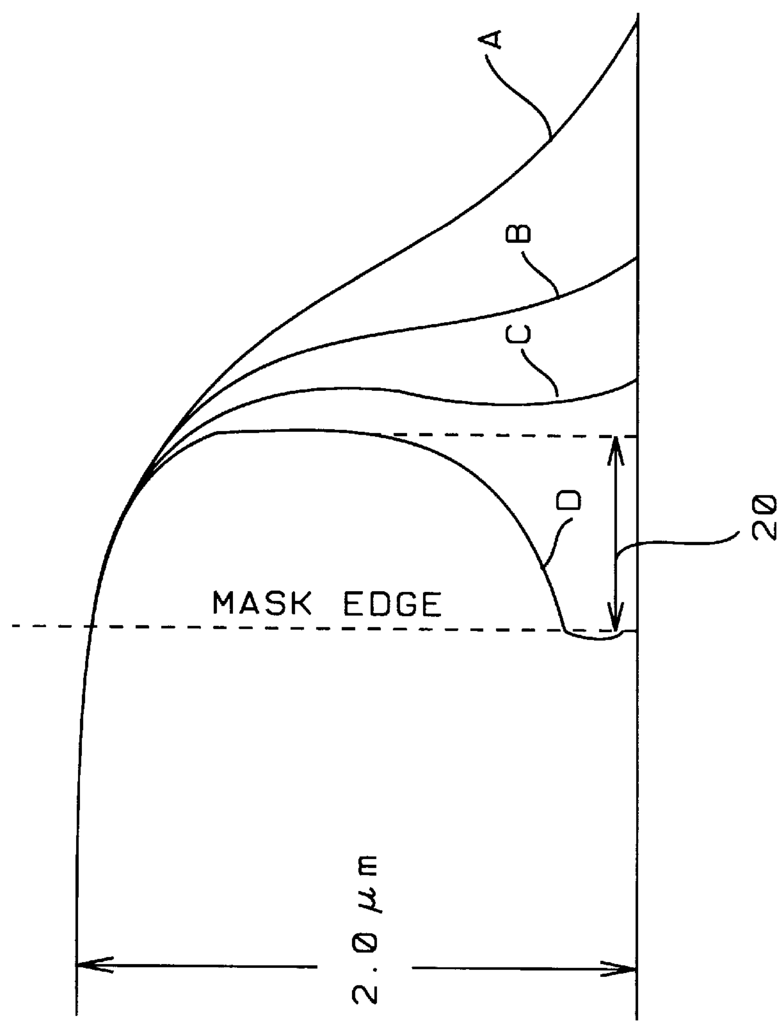
FIG. 8 is a schematic illustration of four first patterned DFR layer profiles for the varying development times A, B, C, and D of FIG. 7.

FIG. 8 is a schematic illustration of four first patterned DFR layer profiles for the varying development times A, B, C, and D of FIG. 7. Profile D of FIG. 8 is the most preferred profile for a first patterned DFR layer 18 having a thickness of about 2.0 μm. Profile D is achieved at a development time of 120 seconds for a 22 μm line width as shown in FIG. 7. The standard development time (SDT) of FIG. 7 is from about 120 to 150 seconds. Profile D has undercut 20 of about 3.70 μm.

Undercut 20 of first patterned DFR layer 18 is vital in the proper formation of under bump metal portion 24 as discussed below.

Formation of UBM Layer and UBM Portion

Figure 2:
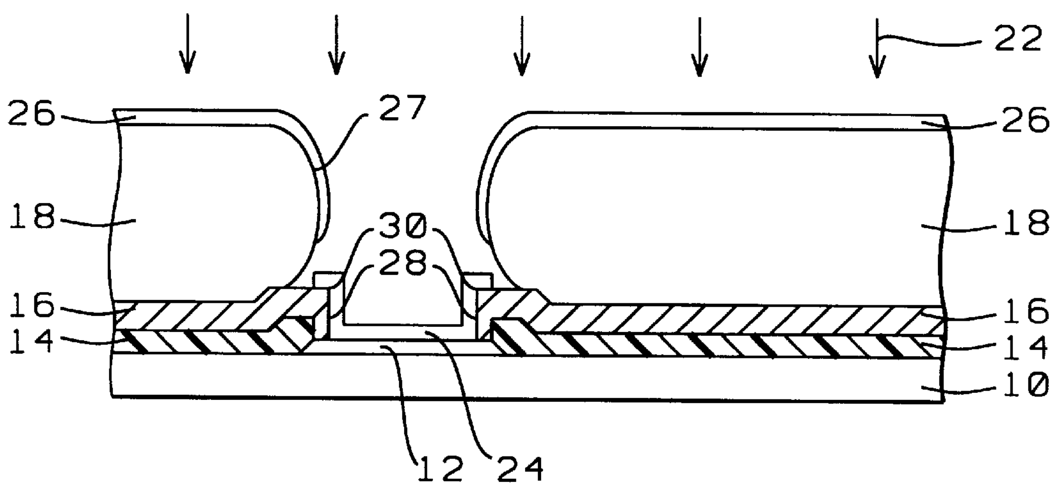

As shown in FIG. 2, under-bump metal (UBM) layer 26 is formed over first patterned DFR layer 18 by a titanium (Ti)+copper (Cu)+nickel (Ni) sputtering 22 with UBM portion 24 formed over exposed I/O pad 12, the vertical sides 28 of polyimide layer 16, and a portion 30 of polyimide layer 16 proximate I/O pad 12.

The Ti+Cu+Ni sputtering 22 to form UBM layer 26 and UBM portion 24. Ti+Cu+Ni UBM layer 26 having a thickness of preferably from about 10,000 to 70,000 Å, and more preferably from about 30.000 to 50,000 Å; and UBM portion 24 having a thickness of preferably from about 10,000 to 70,000 Å, and more preferably from about 30,000 to 50,000 Å. Separate Ti, Cu and Ni sputter layers are formed having the following preferred thicknesses:

Ti layer: from about 1000 to 5000 Å;

Cu layer: from about 20,000 to 60,000 Å; and

Ni layer: from about 20,000 to 50,000 Å.

As shown in FIG. 2, the thickness of UBM layer 26 tapers towards undercut 20 proximate exposed I/O pad 12. This is a function of undercut 20 and permits proper formation of UBM portion 24 over exposed I/O pad 12 and a portion of patterned polyimide layer 16.

Stripping First Patterned DFR Layer/Lifting-off of UBM Layer 26

Figure 3:
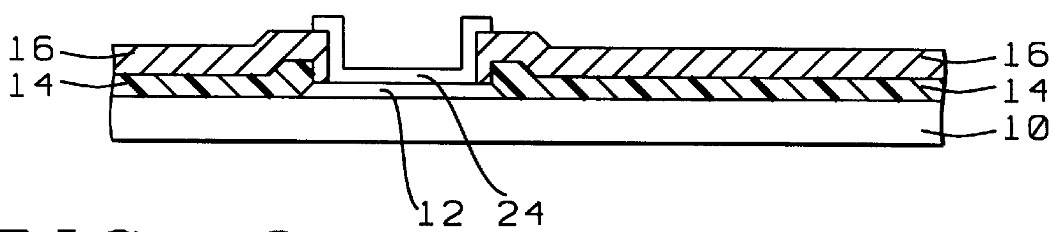

As shown in FIG. 3, first patterned DFR layer 18 is stripped and removed which also removes UBM layer 26 in a lift-off process and effectively patterns UBM layer 26/URM portion 24 to leave UBM portion 24 over I/O pad 12.

Thus, UBM portion 24 is formed and patterned in a simple process without any wet etching processes which thus decreases the cost.

Further processing may then be done to form bump 50 as described below.

Formation of Metal Bump

Figure 4:
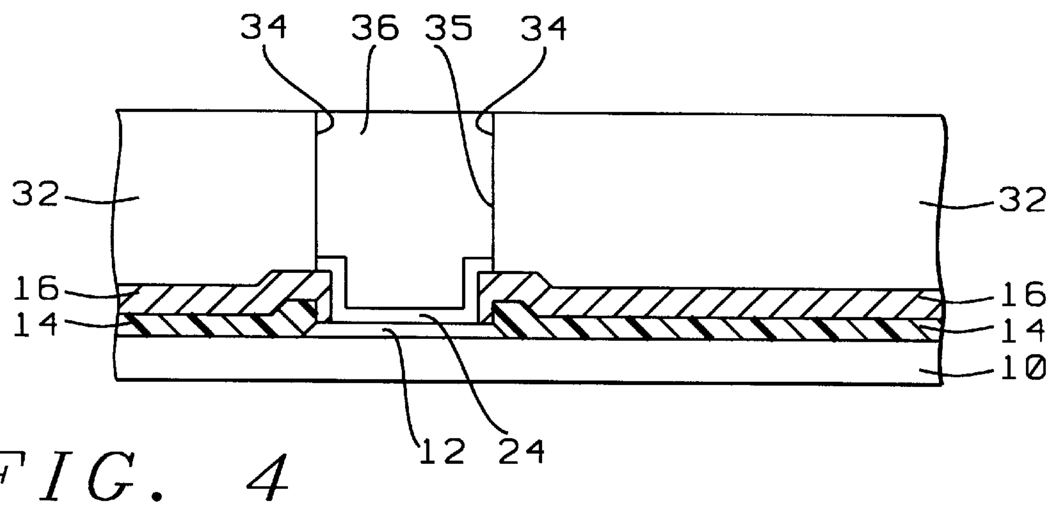
Figure 5:
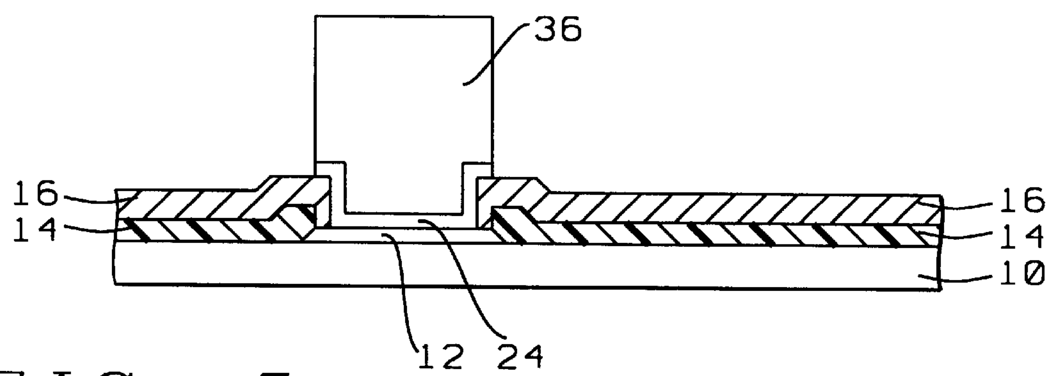
Figure 6:
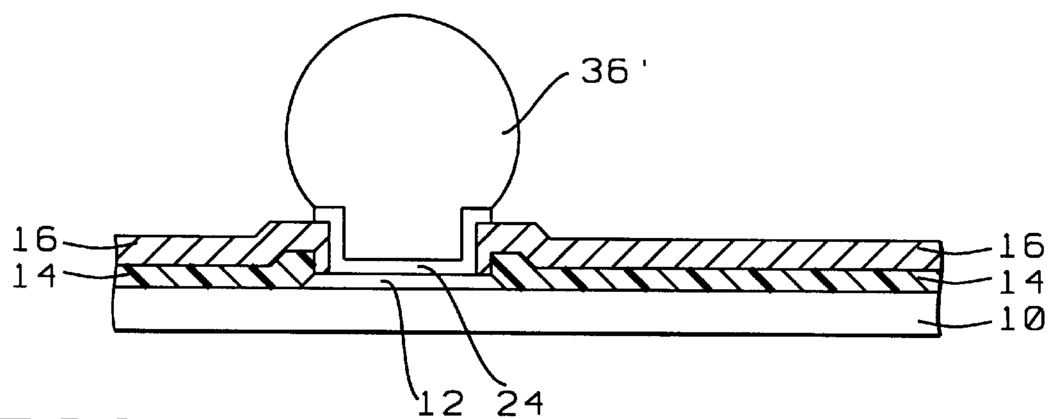

As shown in FIGS. 4 to 6 metal bump ball 36' is formed over UBM portion 24.

As shown in FIG. 4, a second patterned DFR layer 32 is formed over the structure of FIG. 3 exposing UBM portion 24 in a manner similar to that used to form first patterned DFR layer 18 except that it is noted that sides 34 of opening 35 of second patterned DFR layer 32 have a vertical profile, unlike the profile of opening 27 of first patterned DFR layer 18. Solder bump 36 is formed within opening 35 by a screen printing process by depositing the solder paste on the mask; squashing the paste into the mask hole; and removing the mask. Solder bump 36 may be comprised of 95% Pb/5% Sn; or 63% Pb/37% Sn and is preferably 95% Pb/5% Sn.

As shown in FIG. 5, second patterned DFR layer 32 is stripped to effectively pattern solder bump 36 over UBM portion 24.

As shown in FIG. 6, solder bump 36 is reflowed to cure solder bump 36, forming metal bump ball 36' over UBM portion 24.

Advantages of the Present Invention

The advantages of the present invention include:

1) the UBM patterning method of the present invention does not use wet etching processes;

2) the UBM patterning method of the present invention reduces process costs; and 3) the UBM patterning method of the present invention is a simple process.

While particular embodiments of the present invention have been illustrated and described, it is not intended to limit the invention, except as defined by the following claims.

We claim:

1. A method for forming an under bump metal, comprising the steps;

providing a semiconductor structure having an exposed I/O pad;

forming a patterned passivation layer over the semiconductor structure, the patterned passivation layer having an opening exposing a first portion of the I/O pad;

laminating, exposing and developing a dry film resistor (DFR) layer to form a patterned dry film resistor (DFR) layer over the patterned passivation layer; the patterned dry film resistor (DFR) layer having an opening exposing a second portion of the I/O pad; the patterned dry film resistor (DFR) layer opening having opposing side walls with a predetermined profile with an undercut; wherein the undercut of the opposing side wall profile is from about 3.0 to 5.0 μm;

forming a metal layer over the patterned dry film resistor (DFR) layer, the exposed third portion of the I/O pad, and over at least a portion of the opposing side walls of the patterned dry film resistor (DFR) layer opening; and lifting off the patterned dry film resistor (DFR) layer with the metal layer over patterned dry film resistor (DFR) layer and over at least the portion of the opposing side walls, leaving the metal layer over the exposed second portion of the I/O pad; the metal layer over the exposed second portion of the I/O pad being an under bump metal.

2. The method of claim 1, wherein the patterned dry film resistor (DFR) layer is comprised of a material selected from the group consisting of negative photoresist, photo sensitive material and positive photoresist; and the metal layer/under bump metal are comprised of a multi-layer stack of Ti, Cu and Ni.

3. The method of claim 1, wherein the undercut of the opposing side wall profile is from about 3.00 to 3.70 μm.

4. The method of claim 1, wherein the undercut of the opposing side wall profile is from about 3.00 to 3.10 μm.

5. The method of claim 1, wherein a patterned covering layer is formed over the patterned passivation layer before formation of the patterned DFR layer; the patterned covering layer having an opening exposing a third portion of the I/O pad; the patterned DFR layer then being formed over the patterned covering layer.

6. The method of claim 1, wherein a patterned covering polyimide layer is formed over the patterned passivation layer before formation of the patterned DFR layer, the patterned covering polyimide layer having an opening exposing a third portion of the I/O pad; the patterned DFR layer then being formed over the patterned covering polyimide layer.

7. The method of claim 1, further including the following steps:

laminating, exposing and developing a second dry film resistor (DFR) layer to form a second patterned dry film resistor (DFR) layer over the patterned passivation layer; the second patterned dry film resistor (DFR) layer having an opening exposing the under bump metal; the second patterned dry film resistor (DFR) layer opening having substantially vertical sidewalls;

forming a solder bump within the second patterned dry film resistor (DFR) layer opening, filling the opening;

removing the second patterned dry film resistor (DFR) layer, leaving and patterning the solder bump; and reflowing the solder bump to form a rounded metal bump ball.

8. The method of claims 1, wherein the patterned dry film resistor (DFR) layer is developed for a time from about 80 to 120% of the standard development time for the dry film resistor (DFR).

9. The method of claim 1 ,wherein the patterned dry film resistor (DFR) layer is developed for a time from about 90 to 110% of the standard development time for the dry film resistor (DFR).

10. The method of claim 1, wherein the patterned dry film resistor (DFR) layer is from about 8 to 12 $\mu$m thick, the patterned dry film resistor (DFR) layer is developed for from about 120 to 240 seconds, and the patterned dry film resistor (DFR) layer opening profile undercut is from about 3.0 to 5.0 $\mu$m.

11. The method of claim 1, wherein the patterned dry film resistor (DFR) layer is from about 9 to 11 $\mu$m thick, the patterned dry film resistor (DFR) layer is developed for from about 130 to 230 seconds, and the patterned dry film resistor (DFR) layer opening profile undercut is from about 3.00 to 3.70 $\mu$m.

12. The method of claim 1, wherein the patterned dry film resistor (DFR) layer is about 10 $\mu$m thick, the patterned dry film resistor (DFR) layer is developed for from about 150 to 210 seconds, and the patterned dry film resistor (DFR) layer opening profile undercut is from about 3.00 to 3.10 $\mu$m.

13. A method for forming an under bump metal, comprising the steps;

providing a semiconductor structure having an exposed I/O pad;

forming a patterned passivation layer over the semiconductor structure, the patterned passivation layer having an opening exposing a first portion of the I/O pad;

forming a patterned covering layer over the patterned passivation layer, the patterned covering layer having an opening exposing a second portion of the I/O pad;

laminating, exposing and developing a dry film resistor (DFR) layer to form a patterned dry film resistor (DFR) layer over the patterned covering layer, the patterned dry film resistor (DFR) layer having an opening exposing a third portion of the I/O pad; the patterned dry film resistor (DFR) layer opening having opposing side walls with a predetermined profile with an undercut; wherein the patterned dry film resistor (DFR) layer is developed for a time from about 80 to 120% of the standard development time for the dry film resistor (DFR);

forming a metal layer over the patterned dry film resistor (DFR) layer, the exposed third portion of the I/O pad, and over at least a portion of the opposing side walls of the patterned dry film resistor (DFR) layer opening; and lifting off the patterned dry film resistor (DFR) layer with the metal layer over patterned dry film resistor (DFR) layer and over at least the portion of the opposing side walls, leaving the metal layer over the exposed third portion of the I/O pad; the metal layer over the exposed third portion of the I/O pad being an under bump metal.

14. The method of claim 13, wherein the patterned dry film resistor (DFR) layer is comprised of a material selected from the group consisting of negative photoresist, photo sensitive material and positive photoresist; and the metal layer/under bump metal are comprised of a multi-layer stack of Ti, Cu and Ni.

15. The method of claim 13, wherein the undercut of the opposing side wall profile is from about 3.0 to 5.0 $\mu$m.

16. The method of claim 13, wherein the undercut of the opposing side wall profile is from about 3.00 to 3.70 $\mu$m.

17. The method of claim 13, wherein the undercut of the opposing side wall profile is from about 3.00 to 3.10 $\mu$m.

18. The method of claim 13, further including the following steps:

laminating, exposing and developing a second dry film resistor (DFR) layer to form a second patterned dry film resistor (DFR) layer over the patterned covering layer; the second patterned dry film resistor (DFR) layer having an opening exposing the under bump metal; the second patterned dry film resistor (DFR) layer opening having substantially vertical sidewalls;

forming a solder bump within second patterned dry film resistor (DFR) layer opening, filling opening;

removing the second patterned dry film resistor (DFR) layer, leaving and patterning the solder bump; and reflowing the solder bump to form a rounded metal bump ball.

19. The method of claim 13, wherein the patterned dry film resistor (DFR) layer is developed for a time from about 90 to 110% of the standard development time for the dry film resistor (DFR).

20. The method of claim 13, wherein the patterned dry film resistor (DFR) layer is from about 8 to 12 $\mu$m thick, the patterned dry film resistor (DFR) layer is developed for from about 120 to 240 seconds, and the patterned dry film resistor (DFR) layer opening profile undercut is from about 3.0 to 5.0 $\mu$m.

21. The method of claim 13, wherein the patterned dry film resistor (DFR) layer is from about 9 to 11 $\mu$m thick, the patterned dry film resistor (DFR) layer is developed for from about 130 to 230 seconds, and the patterned dry film resistor (DFR) layer opening profile undercut is from about 3.00 to 3.70 $\mu$m.

22. The method of claim 13, wherein the patterned dry film resistor (DFR) layer is about 10 $\mu$m thick, the patterned dry film resistor (DFR) layer is developed for from about 150 to 210 seconds, and the patterned dry film resistor (DFR) layer opening profile undercut is from about 3.00 to 3.10 $\mu$m.

23. The method of claim 13, wherein the patterned dry film resistor (DFR) layer is comprised of a material selected from the group consisting of negative photoresist, photo sensitive material and positive photoresist; the metal layer/under bump metal are comprised of a multi-layer stack of Ti, Cu and Ni; the passivation layer is comprised of a material selected from the group consisting of plasma-enhanced silicon nitride, plasma-enhanced silicon oxide, phosphorous doped spin-on-glass (DSG) or high density plasma silicon oxide; and the covering layer is comprised of polyimide.

24. The method of claim 13, wherein the patterned dry film resistor (DFR) layer is comprised of a negative photoresist material; the metal layer/under bump metal are comprised of a multi-layer stack of Ti, Cu and Ni layers; the passivation layer is comprised of plasma-enhanced silicon nitride; and the covering layer is comprised of polyimide.

25. A method for forming an under bump metal, comprising the steps;

providing a semiconductor structure having an exposed I/O pad;

forming a patterned passivation layer over the semiconductor structure, the patterned passivation layer having an opening exposing a first portion of the I/O pad;

forming a patterned polyimide layer over the patterned passivation layer, the patterned polyimide layer having an opening exposing a second portion of the I/O pad;

laminating, exposing and developing a first dry film resistor (DFR) negative photoresist layer to form a first patterned dry film resistor (DFR) negative photoresist layer over the patterned polyimide layer, the first patterned dry film resistor (DFR) negative photoresist layer having an opening exposing a third portion of the I/O pad; the first patterned dry film resistor (DFR) negative photoresist layer opening having opposing side walls with a predetermined profile with an undercut;

forming a metal layer over the first patterned dry film resistor (DFR) negative photoresist layer, the exposed third portion of the I/O pad, and over at least a portion of the opposing side walls of the first patterned dry film resistor (DFR) negative photoresist layer opening;

lifting off the first patterned dry film resistor (DFR) negative photoresist layer with the metal layer over the first patterned dry film resistor (DFR) negative photoresist layer and over at least the portion of the opposing side walls, leaving the metal layer over the exposed third portion of the I/O pad; the metal layer over the exposed third portion of the I/O pad being an under bump metal;

laminating, exposing and developing a second dry film resistor (DFR) negative photoresist layer to form a second patterned dry film resistor (DFR) negative photoresist layer over the patterned covering layer; the second patterned dry film resistor (DFR) negative photoresist layer having an opening exposing the under bump metal; the second patterned dry film resistor (DFR) negative photoresist layer opening having substantially vertical sidewalls;

forming a solder bump within second patterned dry film resistor (DFR) negative photoresist layer opening, filling opening;

removing the second patterned dry film resistor (DFR) negative photoresist layer, leaving and patterning the solder bump; and reflowing the solder bump to form a rounded metal bump ball.

26. The method of claim 25, wherein the metal layer/under bump metal are comprised of a multi-layer stack of Ti, Cu and Ni layers.

27. The method of claim 25, wherein the undercut of the opposing side wall profile is from about 3.0 to 5.0 $\mu$m.

28. The method of claim 25, wherein the undercut of the opposing side wall profile is from about 3.00 to 3.70 $\mu$m.

29. The method of claim 25, wherein the undercut of the opposing side wall profile is from about 3.00 to 3.10 $\mu$m.

30. The method of claim 25, wherein the first patterned dry film resistor (DFR) negative photoresist layer is developed for a time from about 80 to 120% of the standard development time for the first dry film resistor (DFR) negative photoresist.

31. The method of claim 25, wherein the first patterned dry film resistor (DFR) layer is developed for a time from about 90 to 110% of the standard development time for the first dry film resistor (DFR) negative photoresist.

32. The method of claim 25, wherein the first patterned dry film resistor (DFR) negative photoresist layer is from about 8 to 12 $\mu$m thick, the first patterned dry film resistor (DFR) negative photoresist layer is developed for from about 120 to 240 seconds, and the first patterned dry film resistor (DFR) negative photoresist layer opening profile undercut is from about 3.0 to 5.0 $\mu$m.

33. The method of claim 25, wherein the first patterned dry film resistor (DFR) negative photoresist layer 18 is from about 9 to 11 $\mu$m thick, the first patterned dry film resistor (DFR) negative photoresist layer is developed for from about 130 to 230 seconds, and the first patterned dry film resistor (DFR) negative photoresist layer opening profile undercut is from about 3.00 to 3.70 $\mu$m.

34. The method of claim 25, wherein the first patterned dry film resistor (DFR) negative photoresist layer is about 10 $\mu$m thick, the first patterned dry film resistor (DFR) negative photoresist layer is developed for from about 150 to 210 seconds, and the first patterned dry film resistor (DFR) negative photoresist layer opening profile undercut is from about 3.00 to 3.10 $\mu$m.

35. The method of claim 25, wherein the passivation layer is comprised of a material selected from the group consisting of plasma-enhanced silicon nitride, plasma-enhanced silicon oxide, phosphorous doped spin-on-glass (DSG or high density plasma silicon oxide.

* * * * *